US 8,710,422 B2

(12) United States Patent
Arii et al.

(10) Patent No.: US 8,710,422 B2
(45) Date of Patent: Apr. 29, 2014

(54) IMAGING DEVICE

(71) Applicant: Nikon Corporation, Tokyo (JP)

(72) Inventors: Taku Arii, Yokohama (JP); Yojiro Tezuka, Yokohama (JP); Ryoji Motohana, Maebashi (JP); Satoshi Nakayama, Sagamihara (JP); Wataru Funamizu, Yokohama (JP); Hideki Yamanaka, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/763,936

(22) Filed: Feb. 11, 2013

(65) Prior Publication Data

US 2013/0153750 A1    Jun. 20, 2013

Related U.S. Application Data

(63) Continuation of application No. PCT/JP2011/004560, filed on Aug. 11, 2011.

(30) Foreign Application Priority Data

Aug. 16, 2010  (JP) .................................. 2010-181947
Jul. 22, 2011  (JP) .................................. 2011-160863

(51) Int. Cl.
    *H01L 27/146*      (2006.01)
(52) U.S. Cl.
    USPC .................................................... 250/208.1
(58) Field of Classification Search
    USPC ......... 250/208.1, 214.1, 214 R; 348/300, 308
    See application file for complete search history.

(56) References Cited

U.S. PATENT DOCUMENTS

| 5,471,515 | A | 11/1995 | Fossum et al. |
| 5,793,322 | A | 8/1998 | Fossum et al. |
| 5,841,126 | A | 11/1998 | Fossum et al. |
| 5,880,691 | A | 3/1999 | Fossum et al. |
| 5,886,659 | A | 3/1999 | Pain et al. |
| 5,887,049 | A | 3/1999 | Fossum |
| 5,909,026 | A | 6/1999 | Zhou et al. |
| 5,929,800 | A | 7/1999 | Zhou et al. |
| 5,949,483 | A | 9/1999 | Fossum et al. |
| 5,952,645 | A | 9/1999 | Wang et al. |
| 5,990,506 | A | 11/1999 | Fossum et al. |
| 6,021,172 | A | 2/2000 | Fossum et al. |
| 6,057,539 | A | 5/2000 | Zhou et al. |
| 6,101,232 | A | 8/2000 | Fossum et al. |
| 6,107,618 | A | 8/2000 | Fossum et al. |

(Continued)

FOREIGN PATENT DOCUMENTS

| JP | A-11-122532 | 4/1999 |
| JP | A-2009-44458 | 2/2009 |
| JP | A-2010-11246 | 1/2010 |
| WO | WO 2006/090633 A1 | 8/2006 |

OTHER PUBLICATIONS

International Search Report issued in International Application No. PCT/JP2011/004560 dated Sep. 6, 2011.

(Continued)

*Primary Examiner* — Seung C Sohn
(74) *Attorney, Agent, or Firm* — Oliff PLC

(57) ABSTRACT

A horizontal driving control unit of an imaging device supplies dummy pulse signals to a horizontal driving unit at least at a part of period during a period from a start time point of each horizontal blanking period to a last signal sampling time point defined by a sampling control signal.

11 Claims, 11 Drawing Sheets

(56) References Cited

U.S. PATENT DOCUMENTS

| | | |
|---|---|---|
| 6,107,619 A | 8/2000 | Cunningham et al. |
| 6,115,065 A | 9/2000 | Yadid-Pecht et al. |
| 6,124,819 A | 9/2000 | Zhou et al. |
| 6,166,768 A | 12/2000 | Fossum et al. |
| 6,175,383 B1 | 1/2001 | Yadid-Pecht et al. |
| 6,326,230 B1 | 12/2001 | Pain et al. |
| 6,346,700 B1 | 2/2002 | Cunningham et al. |
| 6,373,050 B1 | 4/2002 | Pain et al. |
| 6,380,572 B1 | 4/2002 | Pain et al. |
| 6,384,413 B1 | 5/2002 | Pain |
| 6,400,824 B1 | 6/2002 | Mansoorian et al. |
| 6,403,963 B1 | 6/2002 | Nikzad et al. |
| 6,456,326 B2 | 9/2002 | Fossum et al. |
| 6,476,860 B1 | 11/2002 | Yadid-Pecht et al. |
| 6,486,503 B1 | 11/2002 | Fossum |
| 6,515,702 B1 | 2/2003 | Yadid-Pecht et al. |
| 6,519,371 B1 | 2/2003 | Pain et al. |
| 6,546,148 B1 | 4/2003 | Yadid-Pecht et al. |
| 6,549,235 B1 | 4/2003 | Fossum et al. |
| 6,555,842 B1 | 4/2003 | Fossum et al. |
| 6,570,617 B2 | 5/2003 | Fossum et al. |
| 6,606,122 B1 | 8/2003 | Shaw et al. |
| 6,665,013 B1 | 12/2003 | Fossum et al. |
| 6,721,464 B2 | 4/2004 | Pain et al. |
| 6,744,068 B2 | 6/2004 | Fossum et al. |
| 6,787,749 B1 | 9/2004 | Zhou et al. |
| 6,801,253 B1 | 10/2004 | Yonemoto et al. |
| 6,801,258 B1 | 10/2004 | Pain et al. |
| 6,825,059 B2 | 11/2004 | Fossum |
| 6,838,301 B2 | 1/2005 | Zheng et al. |
| 6,839,452 B1 | 1/2005 | Yang et al. |
| 6,933,488 B2 | 8/2005 | Pain |
| 6,943,838 B2 | 9/2005 | Fossum et al. |
| 6,944,352 B1 | 9/2005 | Yadid-Pecht et al. |
| 6,980,230 B2 | 12/2005 | Yadid-Pecht et al. |
| 7,002,626 B2 | 2/2006 | Pain et al. |
| 7,019,345 B2 | 3/2006 | Pain et al. |
| 7,053,929 B2 | 5/2006 | Yadid-Pecht et al. |
| 7,105,371 B2 | 9/2006 | Fossum et al. |
| 7,190,398 B1 | 3/2007 | Yadid-Pecht et al. |
| 7,268,814 B1 | 9/2007 | Pain et al. |
| 7,369,166 B2 | 5/2008 | Fossum et al. |
| 2009/0009643 A1 | 1/2009 | Muroshima et al. |
| 2010/0134671 A1 | 6/2010 | Tezuka et al. |

OTHER PUBLICATIONS

International Preliminary Report on Patentability issued in International Patent Application No. PCT/JP2011/004560 dated Feb. 19, 2013 (w/translation).

IMAGING DEVICE

CROSS REFERENCE TO THE RELATED APPLICATIONS

This application is a continuation application of International Application PCT/JP2011/004560, filed Aug. 11, 2011, designating the U.S., and claims the benefit of priority from Japanese Patent Application No. 2010-181947 and Japanese Patent Application No. 2011-160863, filed on Aug. 16, 2010 and Jul. 22, 2011, respectively, the entire contents of which are incorporated herein by reference.

BACKGROUND

1. Field

The present application relates to an imaging device.

2. Description of the Related Art

For example, in a solid-state imaging device disclosed in Japanese Unexamined Patent Application Publication No. H11-122532, plural pixels disposed two-dimensionally each have a photoelectric conversion unit, a charge-voltage conversion unit converting a charge transferred from the photoelectric conversion unit into a voltage, a transfer unit transferring the charge from the photoelectric conversion unit to the charge-voltage conversion unit, an amplifying unit outputting a signal according to a voltage of the charge-voltage conversion unit, and a reset unit resetting the voltage of the charge-voltage conversion unit.

In the solid-state imaging device as stated above, a vertical scanning circuit supplying plural kinds of driving signals driving the pixel (for example, a binary signal turning on/off the transfer unit, a binary signal turning on/off the reset unit) for the plural pixels disposed two-dimensionally is provided by each pixel row (for example, Japanese Unexamined Patent Application Publication No. H11-122532). This vertical scanning circuit generally includes a shift register and the other digital circuits, and output circuits such as a buffer circuit converting the signal obtained by the above-stated circuits into a signal having necessary drive capabilities and so on and outputting as the driving signal.

Besides, the solid-state imaging device as stated above includes vertical signal lines provided to correspond to each column of the plural pixels and to which an output signal of the pixel at the corresponding column is supplied; a sample holed unit sampling and holding a signal according to the signal of each vertical signal line in accordance with a sampling control signal, and supplying the held signal to a horizontal signal line in accordance with a horizontal scanning signal; and a horizontal scanning unit supplying the horizontal scanning signal to the sample hold unit.

In an imaging device using the solid-state imaging device as stated above, a control unit having a horizontal driving control unit supplying plural kinds of pulse signals relating to reading of a signal from the sample hold unit to the horizontal signal line is used as a control unit controlling the solid-state imaging device.

However, in the conventional imaging device as stated above, there is a case when an afterimage phenomenon occurs in which a subject image of last time comes out to a photographed image of next time when the photographed image of last time was a high luminance subject.

SUMMARY

As a means to solve the above-stated problems, respective aspects as follows are proposed. An imaging device according to an example of the present embodiment includes a plurality of pixels being disposed two-dimensionally and each having a photoelectric conversion unit, a charge-voltage conversion unit converting a charge transferred from the photoelectric conversion unit into a voltage, a transfer unit transferring the charge from the photoelectric conversion unit to the charge-voltage conversion unit, an amplifying unit outputting a pixel signal according to the voltage of the charge-voltage conversion unit, and a reset unit resetting the voltage of the charge-voltage conversion unit; a vertical driving unit supplying a driving signal driving the pixels to the plurality of pixels; vertical signal lines being provided to correspond to respective columns of the plurality of pixels and to which the pixel signal is supplied; a sample hold unit sampling and holding the pixel signal supplied to each of the vertical signal lines according to a sampling control signal, and supplying to horizontal signal lines according to a horizontal driving signal; a horizontal driving unit supplying the horizontal driving signal to the sample hold unit; and a horizontal driving control unit supplying a plurality of kinds of pulse signals relating to a reading of the pixel signal from the sample hold unit to the horizontal signal lines. A circuit controlling the reset unit among the vertical driving unit is operated by an identical current source with the horizontal driving unit. The horizontal driving control unit supplies the plurality of kinds of pulse signals to the horizontal driving unit at each horizontal reading period. The horizontal driving control unit supplies dummy pulse signals to the horizontal driving unit at least at a part of period during a period from a start time point of each horizontal blanking period to a last signal sampling time point at the horizontal blanking period from among signal sampling time points defined by the sampling control signal.

An imaging device according to another example of the present embodiment includes a plurality of pixels being disposed two-dimensionally and each having a photoelectric conversion unit, a charge-voltage conversion unit converting a charge transferred from the photoelectric conversion unit into a voltage, a transfer unit transferring the charge from the photoelectric conversion unit to the charge-voltage conversion unit, an amplifying unit outputting a pixel signal according to the voltage of the charge-voltage conversion unit, and a reset unit resetting the voltage of the charge-voltage conversion unit; a vertical driving unit supplying a driving signal driving the pixels to the plurality of pixels; vertical signal lines being provided to correspond to respective columns of the plurality of pixels and to which the pixel signal is supplied; and a sample hold unit sampling and holding the pixel signal according to a signal of each of the vertical signal lines in accordance with a sampling control signal, and supplying the signal being held to horizontal signal lines according to a horizontal driving signal. In this imaging device, the vertical driving unit supplies a driving signal controlling the reset unit to the reset unit to make the reset unit perform a reset operation at least at a part of period from among a period from a last signal sampling time point at the horizontal blanking period to an end time point of the horizontal blanking period at each horizontal blanking period.

DETAILED DESCRIPTION OF THE EMBODIMENTS

Hereinafter, an imaging device according to the present invention is described with reference to the drawings.

First Embodiment

Figure 1:
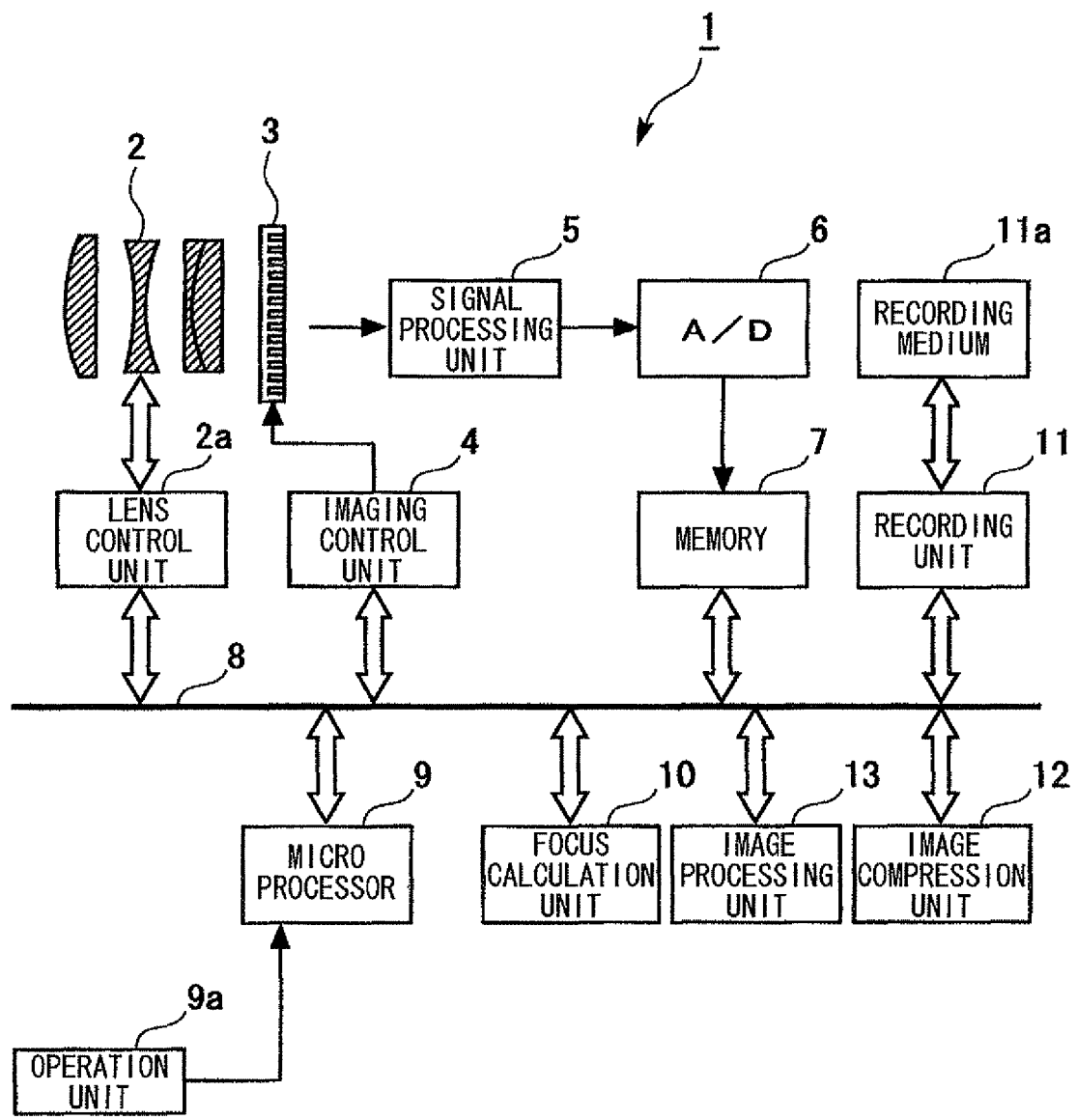
FIG. 1 is a schematic block diagram illustrating an imaging device according to a first embodiment.

FIG. 1 is a schematic block diagram illustrating an imaging device 1 according to a first embodiment of the present invention. The imaging device 1 according to the present embodiment is made up as an electronic camera.

A photographic lens 2 is attached to the imaging device 1 according to the present embodiment. Focus and aperture are driven by a lens control unit 2a in the photographic lens 2. An imaging area of a solid-state imaging device 3 is disposed at an image space of the photographic lens 2.

The solid-state imaging device 3 is driven by a control signal output from an imaging control unit 4, and outputs a signal. The signal output from the solid-state imaging device 3 is processed via a signal processing unit 5, and an A/D conversion unit 6, and thereafter, once stored at a memory 7. The memory 7 is coupled to a bus 8. The lens control unit 2a, the imaging control unit 4, a microprocessor 9, a focus calculation unit 10, a recording unit 11, an image compression unit 12, an image processing unit 13, and so on are also coupled to the bus 8. An operation unit 9a such as a release button is coupled to the microprocessor 9. Besides, a recoding medium 11a is detachably attached to the recording unit 11.

The imaging control unit 4 is made up by a timing generator and so on though they are not illustrated, supplies later-described control signals φGH, φHCLK1, φHCLK2, φHSTR, φRSTH, φVCKL1, φVCKL1, φVSTR, φTVS, φTVN, and so on to a vertical scanning circuit 22 (refer to FIG. 2), a horizontal scanning circuit 23 (refer to FIG. 2), and so on of the solid-state imaging device 3, to control the solid-state imaging device 3.

Figure 2:
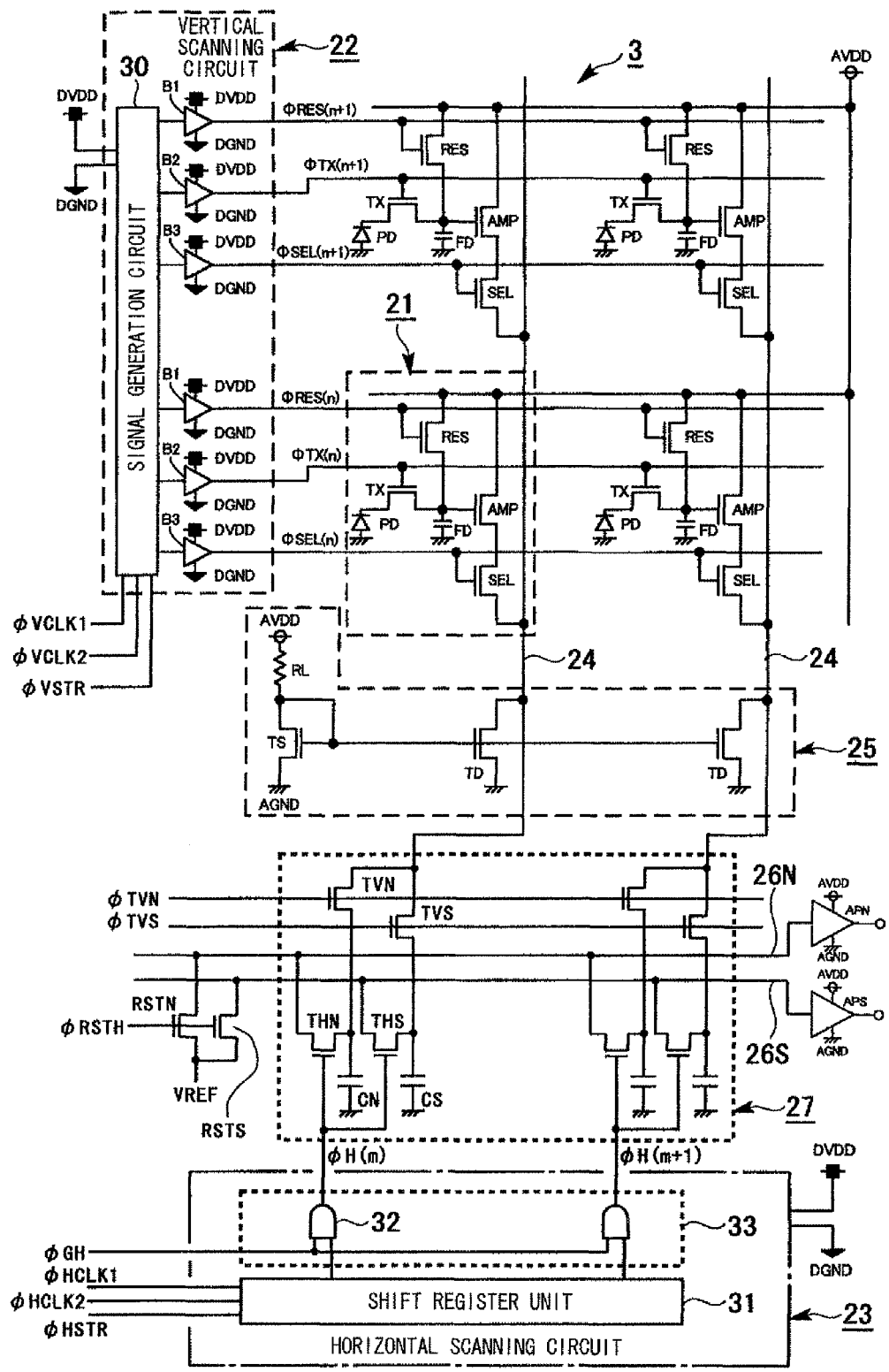
FIG. 2 is a circuit diagram illustrating a schematic configuration of a solid-state imaging device in FIG. 1.

FIG. 2 is a circuit diagram illustrating a schematic configuration of the solid-state imaging device 3 in FIG. 1.

In the present embodiment, the solid-state imaging device 3 includes plural pixels 21 disposed two-dimensionally (only 2×2 pieces of pixels 21 are illustrated in FIG. 2), the vertical scanning circuit (vertical driving unit) 22, the horizontal scanning circuit (horizontal driving unit) 23, vertical signal lines 24 each provided to correspond to each column of the pixels 21 and to which an output signal (pixel signal) of the pixel 21 at the corresponding column is supplied, and a constant current source 25 coupled to each vertical signal line 24 as same as a general CMOS type solid-state imaging device. Note that it goes without saying that the number of the pixels 21 is not limited.

Each pixel 21 includes a photodiode PD as a photoelectric conversion unit generating and storing a charge according to incident light, a floating capacitance unit FD as a charge-voltage conversion unit converting the charge transferred from the photodiode PD into a voltage, a transfer transistor TX as a charge transfer unit transferring the charge from the photodiode PD to the floating capacitance unit FD, an amplifier transistor AMP as an amplifying unit outputting the pixel signal according to the voltage of the floating capacitance unit FD, a reset transistor RES as a reset unit resetting the voltage of the floating capacitance unit FD, and a selection transistor SEL as a selection unit to select the pixel 21 as same as the general CMOS type solid-state imaging device, and they are coupled as illustrated in FIG. 2. Note that the transistors AMP, TX, RES, SEL of the pixel 21 are all nMOS transistors in the present embodiment. Each pixel 21 operates by a first current source, and each amplifier transistor also operates by the first current source. In FIG. 2, a reference symbol AVDD represents a current source potential of the first current source, and a reference symbol AGND represents a ground potential of the first current source.

Figure 3:
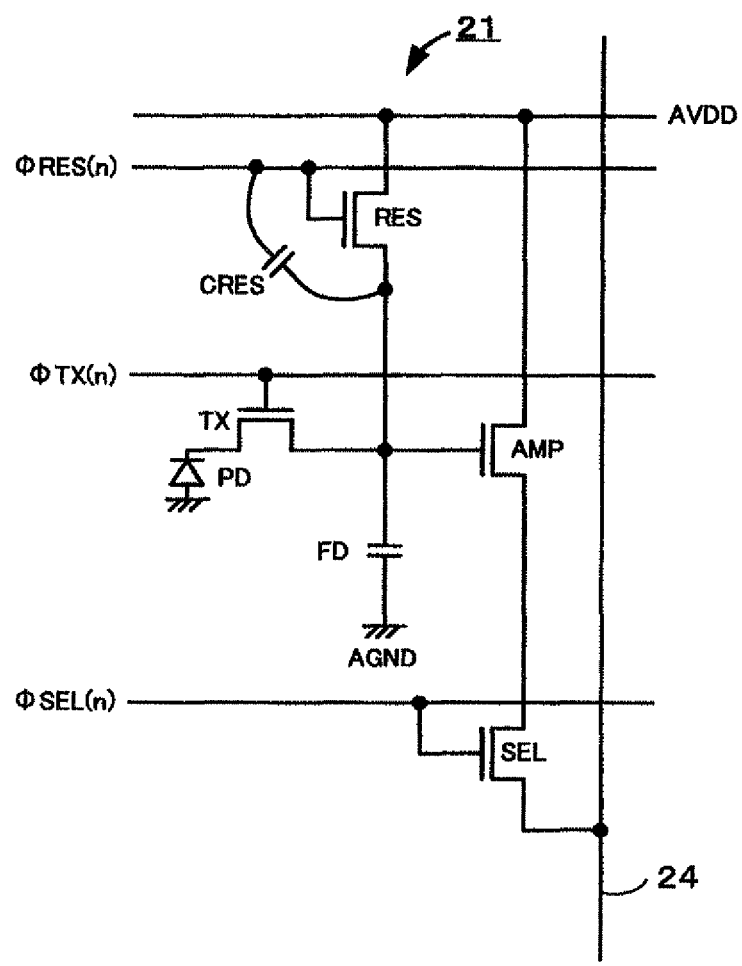
FIG. 3 is a circuit diagram illustrating a parasitic capacitance and so on of one pixel in FIG. 1.

In actual, a parasitic capacitance CRES exists between the floating capacitance unit FD (a gate of the amplify transistor AMP) and a driving signal line of a driving signal φRES at each pixel 21 as illustrated in FIG. 3. FIG. 3 is a circuit diagram illustrating the parasitic capacitance CRES and so on of one pixel 21 in FIG. 2.

When FIG. 2 is referred to again, a gate of the transfer transistor TX is coupled to a driving signal line leading a transfer driving signal φTX from the vertical scanning circuit 22 by each pixel row. A gate of the reset transistor RES is coupled to a driving signal line leading a driving signal φRES from the vertical scanning circuit 22 by each pixel row. A gate of the selection transistor SEL is coupled to a driving signal line leading a driving signal φSEL from the vertical scanning circuit 22 by each pixel row.

The photodiode PD generates a signal charge according to light intensity (subject light) of incident light. The transfer transistor TX is turned on at a high level period of a transfer pulse (driving signal) φTX, and transfers the signal charge stored at the photodiode PD to the floating capacitance unit FD. The reset transistor RES is turned on at a high level period of a reset pulse (driving signal) φRES, and resets the floating capacitance unit FD.

In the amplifier transistor AMP, a drain is coupled to the current source potential AVDD of the first current source, a gate is coupled to the floating capacitance unit FD, a source is coupled to a drain of the selection transistor SEL, makes up the constant current source 25, and made up a source follower circuit of which load is a transistor TD provided to correspond to each vertical signal line 24. A drain of each transistor TD is coupled to each vertical signal line 24, and a source of each transistor TD is coupled to the ground potential AGND of the first current source. Gates of respective transistors TD are coupled in common, and a constant voltage obtained by a constant current setting circuit made up of a resistance RL and a transistor TS coupled between the current source potential AVDD and the ground potential AGND of the first current source is supplied thereto. The constant current source 25 thereby makes a current flow to the vertical signal line 24 when the selection transistor SEL of the pixel 21 corresponding to the vertical signal line 24 is turned on. This current is a source follower bias current of the amplifier transistor AMP of the pixel 21.

The amplifier transistor AMP outputs a voltage to the vertical signal line 24 via the selection transistor SEL according to a voltage value of the floating capacitance unit FD. The selection transistor SEL is turned on at a high level period of a selection pulse (driving signal) φSEL, and couples the source of the amplifier transistor AMP to the vertical signal line 24.

The vertical scanning circuit 22 receives the two-phase vertical driving clock signals φVCLK1, φVCLK2 and the vertical start pulse signal φVSTR as vertical driving control signals each made up of a pulse signal from the imaging control unit 4, and outputs the selection pulse φSEL, the reset pulse φRES, and the transfer pulse φTX by each row of the pixel 21. In FIG. 2, a reference symbol "n" indicates that it is a signal of a pixel at an n-th row. In the present embodiment, the vertical scanning circuit 22 is made up of a signal generation circuit 30 and buffer circuits B1 to B3. The signal generation circuit 30 includes a shift register and the other digital circuits, receives the vertical driving control signals from the imaging control unit 4, and generates signals respectively corresponding to the selection pulse φSEL, the reset pulse φRES, and the transfer pulse φTX by each pixel row. Accordingly, all of the digital circuits other than the buffer circuits 131 to 133 at the vertical scanning circuit 22 are included in the signal generation circuit 30. The buffer circuits B1 to B3 are provided by each pixel row. Each buffer circuit B1 converts a signal from the signal generation circuit 30 corresponding to the reset pulse φRES into the reset pulse φRES having necessary drive capabilities and so on, and outputs it by the one corresponding to each pixel row. Each buffer circuit 132 converts a signal from the signal generation circuit 30 corresponding to the transfer pulse φTX into the transfer pulse φTX having necessary drive capabilities and so on, and outputs it by the one corresponding to each pixel row. Each buffer circuit 133 converts a signal from the signal generation circuit 30 corresponding to the selection pulse φSEL into the selection pulse φSEL having necessary drive capabilities and so on, and outputs it by the one corresponding to each pixel row. In the present embodiment, the buffer circuits 81 to 133 make up a drive output circuit outputting three kinds of driving signals φRES, φTX, and φSEL driving the pixel 21.

In the present embodiment, the signal generation circuit 30 and the buffer circuits B1 to B3 of the vertical scanning circuit 22 operate by a second current source of another system different from the first current source (the ground potential AGND and the current source potential AVDD). In FIG. 2, a reference symbol DVDD represents a current source potential of the second current source, and a reference symbol DGND is a ground potential of the second current source.

The horizontal scanning circuit 23 receives the horizontal driving control signals φGH, φHCLK1, φHCLK2, and φHSTR each made up of a pulse signal from the imaging control unit 4, and outputs a horizontal scanning signal (horizontal driving signal) φH by each column. In FIG. 2, a reference symbol "m" indicates that it is a signal of a pixel at an m-th column. In the present embodiment, the horizontal scanning circuit 23 includes a shift register unit 31 driven by receiving the two-phase horizontal driving dock signals φHCLK1, φHCLK2 and the horizontal start pulse signal φHSTR from the imaging control unit 4, and a gate unit 33 made up of an AND gate 32 provided by each column and generates the horizontal scanning signal φH by gating an output signal at each stage of the shift register unit 31 in accordance with the gate control signal φGH from the imaging control unit 4. One input terminals of respective AND gates 32 are coupled in common, and the gate control signal φGH is input thereto. An output signal of each stage of the shift register unit 31 is input to the other input terminal of each AND gate 32. The gate control signal φGH is a pulse signal to set a pulse width and so on of the horizontal scanning signal φH. The horizontal scanning signal φH of each column is output from an output terminal of each AND gate 32. As it is obvious from the above-stated description, the horizontal driving control signals φGH, φHCLK1, φHCLK2, and φHSTR are supplied to the horizontal scanning circuit 23, and are pulse signals to make the horizontal scanning circuit 23 generate the horizontal scanning signal φH.

The horizontal scanning circuit 23 operates by the second current source (the ground potential DGND and the current source potential DVDD) as same as the vertical scanning circuit 22.

Besides, the solid-state imaging device 3 includes the sample hold unit 27 sampling and holding a signal according to a signal of each vertical signal line 24 in accordance with the sampling control signals φTVN, φTVS and supplying the held signal to horizontal signal lines 26N, 26S in accordance with the horizontal scanning signal φH. In the present embodiment, the sample hold unit 27 includes a photo signal storage capacitance CS and a dark signal storage capacitance CN provided to correspond to each vertical signal line 24, a photo signal sampling switch TVS storing a photo signal containing photo information which is photoelectrically converted at the pixel 21 at the photo signal storage capacitance CS in accordance with the photo signal sampling control signal φTVS, a dark signal sampling switch TVN storing so-called a dark signal as a difference-purpose signal containing a noise component to be subtracted from the photo signal at the dark signal storage capacitance CN in accordance with the dark signal sampling control signal φTVN, a photo signal horizontal transfer switch THS supplying the photo signal stored at the photo signal storage capacitance CS to the photo signal horizontal signal line 26S in accordance with the horizontal scanning signal φH, and a dark signal horizontal transfer switch THN supplying the dark signal stored at the dark signal storage capacitance CN to the dark signal horizontal signal line 26N in accordance with the horizontal scanning signal φH. Output amplifiers APS, APN are respectively coupled to the horizontal signal lines 26S, 26N. In the present embodiment, all of the switches TVS, TVN, THS, THN are aMOS transistors.

Gates of the respective photo signal sampling switches TVS are coupled in common, and the photo signal sampling control signal φTVS is supplied thereto from the imaging control unit 4. When the photo signal sampling switch TVS is turned on according to the photo signal sampling control signal φTVS, the photo signal of the vertical signal line 24 is stored at the corresponding photo signal storage capacitance CS. A level of the photo signal stored at the photo signal storage capacitance CS is determined depending on a level of the signal of the vertical signal line 24 at a time point when the photo signal sampling switch TVS is turned off (namely, at a falling time point of the φTVS). Namely, the falling time point of the photo signal sampling control signal φTVS is the sampling time point of the photo signal.

Gates of the respective dark signal sampling switches TVN are coupled in common, and the dark signal sampling control signal φTVN is supplied thereto from the imaging control unit 4. When the dark signal sampling switch TVN is turned on according to the dark signal sampling control signal φTVN, the dark signal of the vertical signal line 24 is stored at the corresponding dark signal storage capacitance CN. A level of the dark signal to be stored at the dark signal storage capacitance CN is determined depending on a level of the signal of the vertical signal line 24 at a time point when the dark signal sampling switch TVN is turned off (namely, at a falling time point of the φTVN). Namely, the falling time point of the dark signal sampling control signal φTVN is the sampling time point of the dark signal.

Gates of the photo signal horizontal transfer switch THS and the dark signal horizontal transfer switch THN are coupled in common by each column, and the horizontal scanning signal φH at a corresponding column is supplied thereto from the horizontal scanning circuit 23. When the horizontal transfer switches THS, THN at each column are turned on according to the horizontal scanning signal φH of each column, the photo signal and the dark signal respectively stored at the photo signal storage capacitance CS and the dark signal storage capacitance CN at an corresponding column are respectively output to the photo signal horizontal signal line 26S and the dark signal horizontal signal line 26N, and they are respectively output to the signal processing unit 5 in FIG. 1 via the output amplifiers APS, APN. The output amplifiers APS, APN operate by the first current source (the ground potential AGND and the current source potential AVDD).

Further, the solid-state imaging device 3 includes horizontal line reset transistors RSTS, RSTN to respectively reset the horizontal signal lines 26S, 26N to a predetermined potential VREF in accordance with a horizontal line reset control signal φRSTH. In the present embodiment, all of the horizontal line reset transistors RSTS, RSTN are nMOS transistors. Gates of the horizontal line reset transistors RSTS, RSTN are coupled in common, and the horizontal line reset control signal φRSTH is supplied thereto from the imaging control unit 4. When the horizontal line reset transistors RSTS, RSTN are turned on according to the horizontal line reset control signal φRSTH, the horizontal signal lines 26S, 26N are each reset to the predetermined potential VREF. The horizontal line reset control signal φRSTH is a pulse signal relating to reading of the signal from the sample hold unit 27 to the horizontal signal lines 26S, 26N as same as the horizontal driving control signals φGH, φHCLK1, φHCLK2, and φHSTR.

The signal processing unit 5 obtains a difference between outputs of the output amplifiers APS, APN by a differential amplifier and so on though they are not illustrated. A correlated double sampling is thereby enabled, and a photo information signal from which a fixed pattern noise and so on are removed is obtained from an external signal processing unit as an image signal. Note that the differential amplifier and so on obtaining such a difference may be mounted on the solid-state imaging device 3.

In the present embodiment, a part functioning to supply the pulse signals φGH, φHCKL1, φHCKL2, φHSTR, φRSTH relating to the reading of the signals from the sample hold unit 27 to the horizontal signal lines 26S, 26N at the imaging control unit 4 makes up the horizontal driving control unit. In the present embodiment, the horizontal driving control unit (namely, the imaging control unit 4) is made up to supply signals which are the same as one or more kinds of the pulse signals φGH, φHCLK1, φHCLK2, and φRSTH from among the plural kinds of pulse signals φGH, φHCLK1, φHCLK2, φHSTR, and φRSTH to the horizontal scanning circuit 23 as dummy pulse signals at least at a part of a period from among a period from a start time point of each horizontal blanking period until a last signal sampling time point at the horizontal blanking period from among the signal sampling time points determined by the sampling control signals φTVN, φTVS. This point will be described later in detail with reference to FIG. 4.

Figure 4:
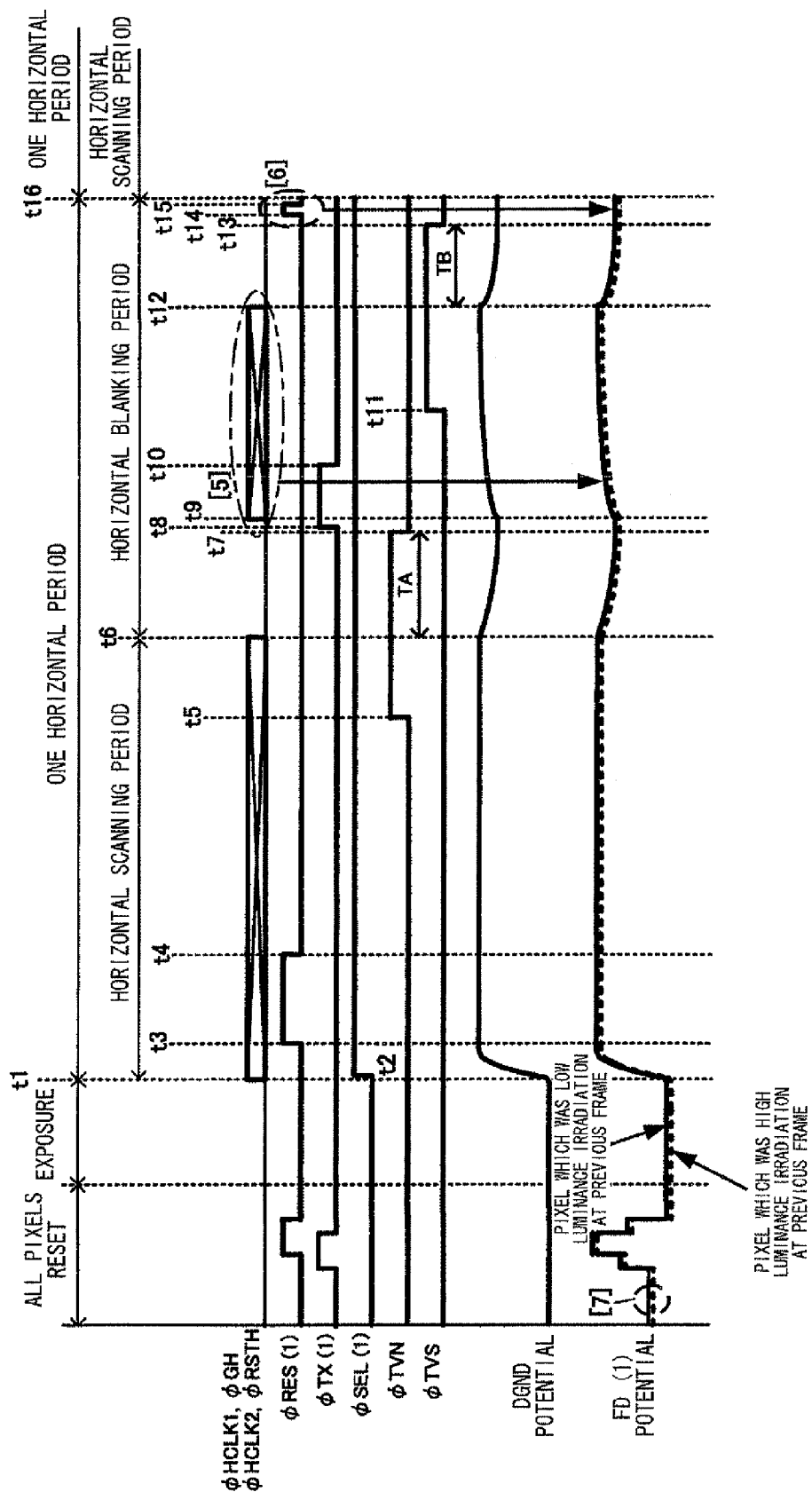
FIG. 4 is a timing chart illustrating an operation of the imaging device according to the first embodiment.

Note that in the description of FIG. 4 and the following, the same reference symbols φGH, φHCLK1, φHCLK2, and φRSTH are added for the dummy pulse signals respectively corresponding to the pulse signals φGH, φHCLK1, φHCLK2, and φRSTH. Parts within the horizontal scanning period (horizontal reading period) are the original pulse signals (the pulse signals relating to the reading of the signals from the sample hold unit 27 to the horizontal signal lines 26S, 26N), and parts within the horizontal blanking period are the dummy pulse signals from among the signals φGH, φHCLK1, φHCLK2, and φRSTH.

Figure 6:
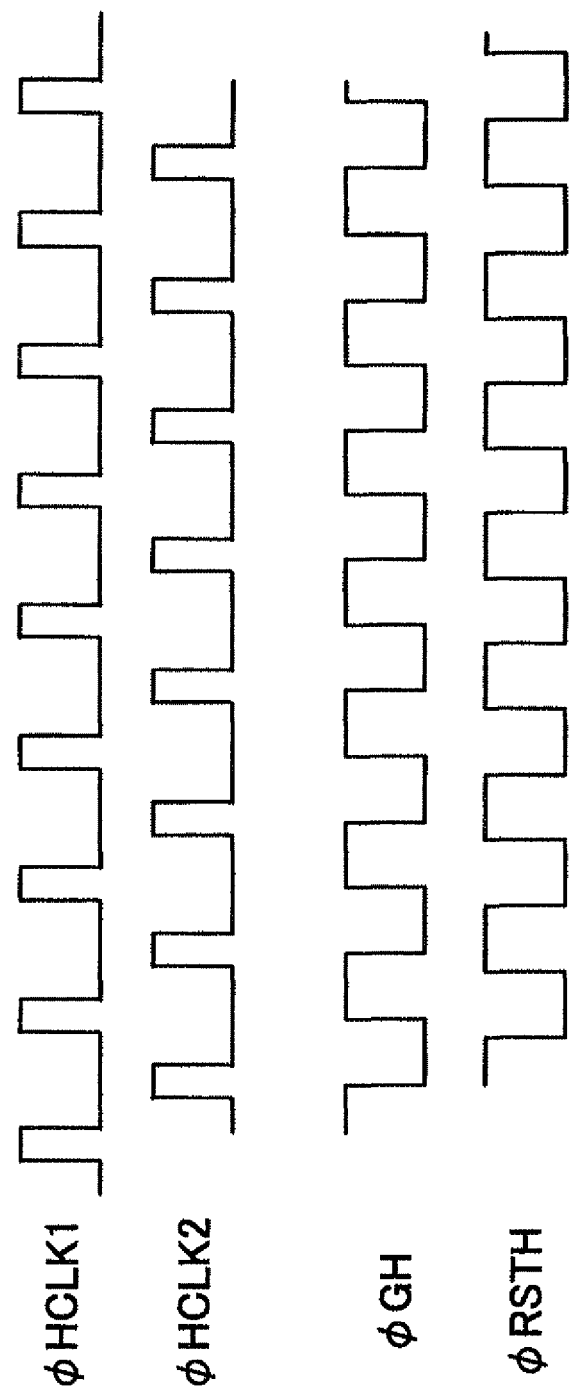
FIG. 6 is a timing chart illustrating a part of the timing chart illustrated in FIG. 4 while temporally enlarging.

FIG. 4 is a timing chart illustrating an example of a reading operation of the imaging device 1 according to the present embodiment. In FIG. 4, periods each indicated by a square with a "x" mark inside thereof represent periods when the control signals φGH, φHCLK1, φHCLK2, and φRSTH are repeatedly generated at high frequency as the pulse signals. During this period, these control signals φGH, φHCLK1, φHCLK2, and φRSTH become the same waveforms as illustrated in FIG. 6 when a part of this period is temporally enlarged to be illustrated. As it can be seen from FIG. 6, these control signals φGH, φHCLK1, φHCLK2, and φRSTH have the same frequency, but pulse widths and phases are set as illustrated in FIG. 6. Note that the horizontal start pulse signal φHSTR is at low level as a steady state, and becomes one pulse at high level only at a start time of later-described each horizontal scanning period though it is not illustrated. In FIG. 4, the control signals φGH, φHCLK1, φHCLK2, and φRSTH are each stopped and fixed at high level or low level at periods other than the periods each indicated by the square with the "x" mark inside thereof though they are not obviously illustrated.

In the present embodiment, a mechanical shutter (not-illustrated) is opened for a predetermined exposure period after all pixels reset is performed, and after a charge is stored at a charge storage layer of the photodiode PD of each pixel 21, one horizontal period corresponding to each one row is sequentially processed, and thereby, the row is sequentially selected one by one, and the same operation is sequentially performed for each one row. FIG. 4 mainly illustrates operations when the all pixels reset period, the exposure period, and one horizontal period relating to the pixel 21 at the first row are performed, and subsequently, one horizontal period relating to the pixel 21 at a second row is performed. Note that at the all pixels reset period, the reset pulses φRES for all rows are once set at high level simultaneously, and the φTX for all rows are once set at high level simultaneously.

Figure 5:
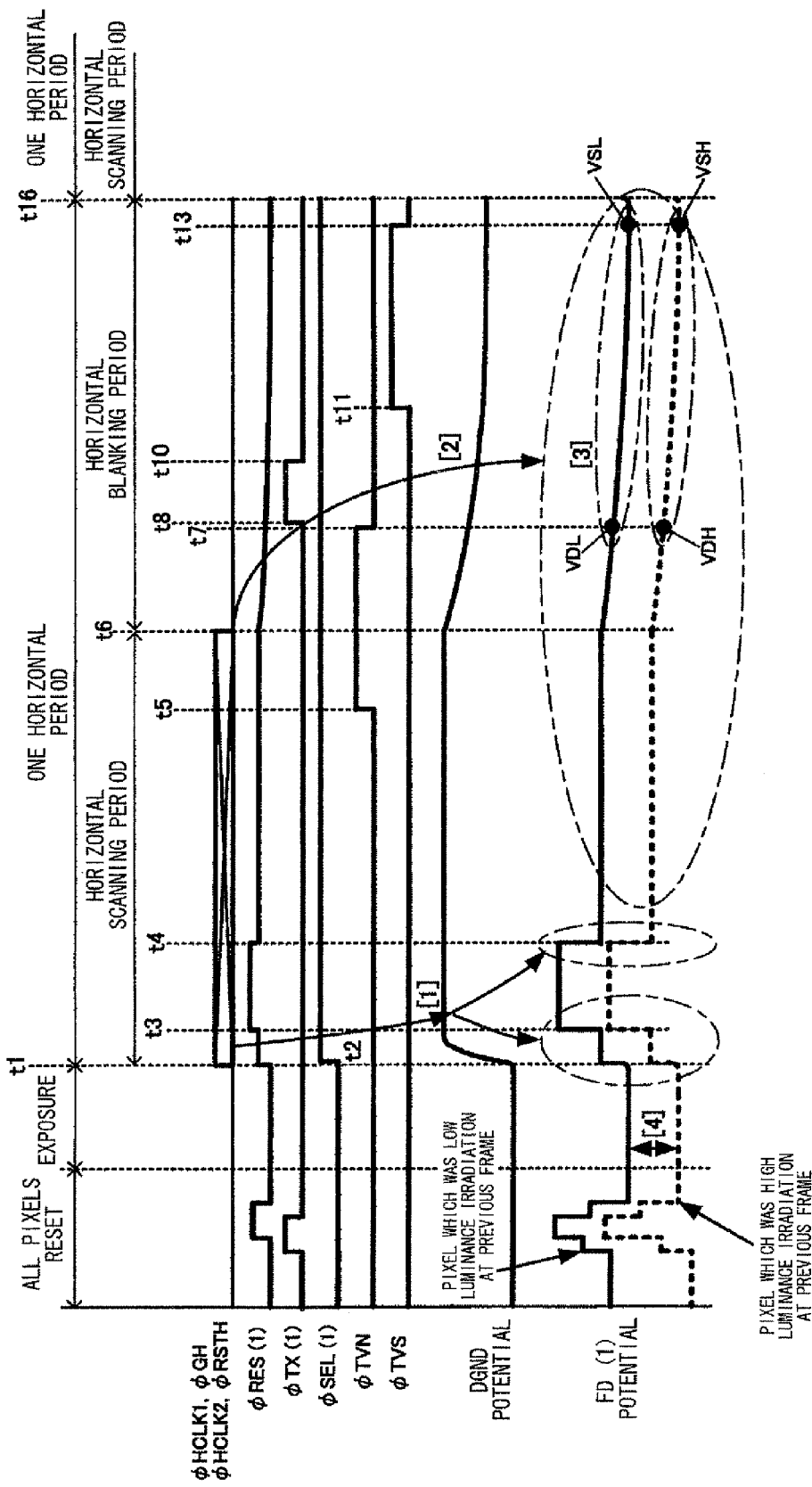
FIG. 5 is a timing chart illustrating an operation of an imaging device according to a comparative example.

These points are the same as in FIG. 5 described in the following. FIG. 5 is a timing chart illustrating a reading operation of an imaging device according to a comparative example compared to the imaging device 1 according to the present embodiment. In FIG. 5, the same reference symbols are added for the same or corresponding signals and so on as the signals and so on in FIG. 4.

Different points of the imaging device according to the comparative example from the imaging device 1 according to the present embodiment are only a control of the imaging control unit 4 and a control of the horizontal scanning circuit 23.

Specifically, in the present embodiment, the dummy pulse signals φGH, φHCLK1 φHCLK2, and φRSTH are supplied at a period t9 to t12 during the horizontal blanking period of the horizontal period of the first row (refer to [5] in FIG. 4), and it is the same as for the other horizontal periods. However, in the comparative example, these pulse signals φGH, φHCLK1 φHCLK2, and φRSTH are stopped even at the period t9 to t12 during the horizontal blanking period of the horizontal period of the first row as illustrated in FIG. 5, and it is the same as for the other horizontal periods. Besides, in the present embodiment, the reset pulse φRES (1) is set at high level at a period t4 to t15 during the horizontal blanking period of the horizontal period of the first row (refer to [6] in FIG. 4) and it is the same as for the other periods. However, in the comparative example, the reset pulse φRES (1) is stayed at low level even at the period t4 to t15 during the horizontal blanking period of the horizontal period of the first row as illustrated in FIG. 5, and it is the same as for the other horizontal periods. According to these differences, the potentials of the ground potential DGND of the second current source and the reset pulse φRES are different between the present embodiment and the comparative example as illustrated in FIG. 4 and FIG. 5. As it can be seen from FIG. 2 and FIG. 3, the low level of the reset pulse φRES is supplied from the ground potential DGND.

The differences between the present embodiment and the comparative example are only the points as stated above, and therefore, the reading operation of the imaging device according to the comparative example is described in advance with reference to FIG. 5 for easy to understanding.

A period t1 to t16 is one horizontal period relating to the pixel 21 at the first row. Among the period, a period t1 to t6 is the horizontal scanning period (horizontal reading period), and a period t6 to t16 is the horizontal blanking period. In the comparative example, the high frequency pulse signals φGH, φHCLK1, φHCLK2, and φRSTH are supplied at the horizontal scanning period t1 to t6, and the pulse signals φGH, φHCLK1, φHCLK2, and φRSTH are stopped at the horizontal blanking period t6 to t16.

At a period t3 to t4 after a time point t1, the reset pulse φRES (1) is set at high level, and the reset transistor RES is turned on. On the other hand, the reset pulse φRES (1) is set at low level and the reset transistor RES of the first row is turned off at the remaining periods t1 to t3, t4 to t16 from among the horizontal period t1 to t16. At a period t2 to t16 starting from a time point t2 after the time point t1 and before a time point t3, the selection pulse φSEL (1) is set at high level, and the selection transistor of the first row is turned on. The source of the amplifier transistor AMP of the first row is coupled to the vertical signal line 24 by the turning on of the selection transistor SEL of the first row.

At a period t4 to t8, the selection transistor SEL of the first row is turned on, and the reset transistor RES of the first row is simultaneously turned off, and thereby, a gate voltage of the amplifier transistor AMP of the pixel 21 at the first row becomes a floating state, and a reset level of the pixel 21 at the first row appears at the vertical signal line 24. At this time, at a period t5 to t7 starting at a time point t5 after a time point t4 and ending at a time point t7 before a time point t8, the dark signal sampling pulse (control signal) φTVN changes into high level, and the dark signal sampling switch TVN is turned on. The dark signal of the pixel 21 at the first row is thereby stored at the dark signal storage capacitance CN. This operation is simultaneously performed in parallel for the pixels 21 of respective columns at the first row. A level of the dark signal stored at the dark signal storage capacitance CN is determined depending on a level of the signal of the vertical signal line 24 at a time point when the dark signal sampling switch TVN is turned off (namely, at a falling time point t7 of the φTVN). Namely, the falling time point t7 of the dark signal sampling control signal φTVN becomes a sampling time point of the dark signal.

Next, at a period t8 to t10, the transfer pulse φTX (1) of the first row changes into high level, and the transfer transistor TX of the first row is turned on. A signal charge photoelectrically converted and stored at the photodiode PD of the pixel 21 at the first row is transferred to the corresponding floating capacitance unit FD by the turning on of the transfer transistor TX of the first row. A voltage of the floating capacitance unit FD thereby becomes a voltage according to the transferred electric charge amount, and this voltage is applied to a gate electrode of the amplifier transistor AMP. As a result, a level of the pixel 21 at the first row containing photo information appears at the vertical signal line 24. At this time, at a period t11 to t13 after the period t8 to t10, the photo signal sampling pulse (control signal) φTVS changes into high level, and the photo signal sampling switch TVS is turned on. A photo signal of the pixel 21 at the first row is thereby stored at the photo signal storage capacitance CS. This operation is simultaneously performed in parallel for the pixels 21 of respective columns at the first row. A level of the photo signal stored at the photo signal storage capacitance CS is determined by a level of a signal of the vertical signal line 24 at a time point when the photo signal sampling switch TVS is turned off (namely, at a falling time point t13 of the φTVS). Namely, the falling time point t13 of the photo signal sampling control signal φTVS becomes a sampling time point of the photo signal.

The sampling of the output signal of the pixel 21 at the first row is performed as stated above at the horizontal period t1 to t16, the dark signal of the pixel 21 at the first row is stored at the dark signal storage capacitance CN, and the photo signal of the pixel 21 at the first row is stored at the photo signal storage capacitance CS by each column.

At the horizontal scanning period of the horizontal period subsequent to the horizontal period t1 to t16, the dark signal horizontal transfer switch THN and the photo signal horizontal transfer switch THS are sequentially turned on by the one corresponding to each vertical signal line 24 by the horizontal scanning by means of the horizontal scanning signal 4H from the horizontal scanning circuit 23. The dark signal and the photo signal respectively stored at the storage capacitances CN, CS are sequentially and respectively read out to the dark signal horizontal signal line 26N and the photo signal horizontal signal line 26S by the one corresponding to each vertical signal line 24, and they are respectively output to the signal processing unit 5 via the output amplifiers APN, APS. The signal processing unit 5 obtains a difference between outputs of the output amplifiers APS, APN by the differential amplifier and so on. The correlated double sampling (CDS) is thereby performed, and a photo information signal of which fixed pattern noise and so on are removed is obtained from the signal processing unit 5 as an image signal.

At the horizontal period at a time point t16 and later, the operation similar to the operation performed for the first row at the horizontal scanning period t1 to t16 is performed for the second row, and subsequently, the similar operation is repeated.

Incidentally, in this comparative example, the high frequency pulse signals φGH, φHCLK1, φHCLK2, and φRSTH are supplied at the horizontal scanning period t1 to t6, and the pulse signals φGH, φHCLK1, φHCLK2, and φRSTH are stopped at the horizontal blanking period t6 to t16 as stated above. During the high frequency pulse signals φGH, φHCLK1, φHCLK2, and φRSTH are supplied, the DGND potential (an off potential of the reset transistor RES) varies toward a plus side caused by an IR drop (a potential drop caused by a resistance component of wirings and so on), and the floating capacitance unit FD (1) of the pixel 21 at the first row similarly operates by a coupling resulting from the parasitic resistance CRES of the gate of the reset transistor RES (refer to [1] in FIG. 5).

At the period t6 to t16 after the pulse signals φGH, φHCLK1, φHCLK2, and φRSTH are stopped, the DGND potential tries to return to "0" (zero) V while taking time, and the potential of the floating capacitance unit FD (1) of the pixel 21 at the first row similarly tries to return to an original potential by the coupling resulting from the parasitic capacitance CRES of the gate of the reset transistor RES (refer to [2] in FIG. 5).

Accordingly, the floating capacitance unit FD (1) of the pixel 21 at the first row also decreases from the dark signal sampling time point t7 to the photo signal sampling time point. A sampling potential as the photo signal (the potential at the time point t13) thereby becomes lower than a sampling potential as the dark signal (the potential at the time point t7) (refer to [3] in FIG. 5). As a result of the above-stated CDS, an output becomes a plus output. The above-stated points are the same as for the pixels 21 at the other rows, and therefore, a whole screen becomes a state of white floating.

The potential of the floating capacitance unit FD at a frame reading time of this time becomes different depending on an irradiation light amount of a previous frame, and the potential of the floating capacitance unit FD of the pixel 21 at the frame reading time of this time which was high luminance irradiation at the previous frame becomes lower than the potential of the floating capacitance unit FD of the pixel 21 at the frame reading time of this time which was low luminance irradiation at the previous frame (refer to [4] in FIG. 5). This is because the floating capacitance unit FD cannot be completely reset by the all pixels reset.

Accordingly, a dark signal potential of the pixel 21 which was low luminance irradiation at the previous frame (the potential of the floating capacitance unit FD (1) at the time point t7) is set to be VDL, a photo signal potential of the pixel 21 which was low luminance irradiation at the previous frame (the potential of the floating capacitance unit FD (1) at the time point t13) is set to be VSL, the dark signal potential of the pixel 21 which was high luminance irradiation at the previous frame (the potential of the floating capacitance unit FD (1) at the time point t7) is set to be VDH, and the photo signal potential of the pixel 21 which was high luminance irradiation at the previous frame (the potential of the floating capacitance unit FD (1) at the time point t13) is set to be VSH, a relationship of VDL>VSL, VDH>VSH, VDL>VDH, VSL>VSH is satisfied.

Figure 7:
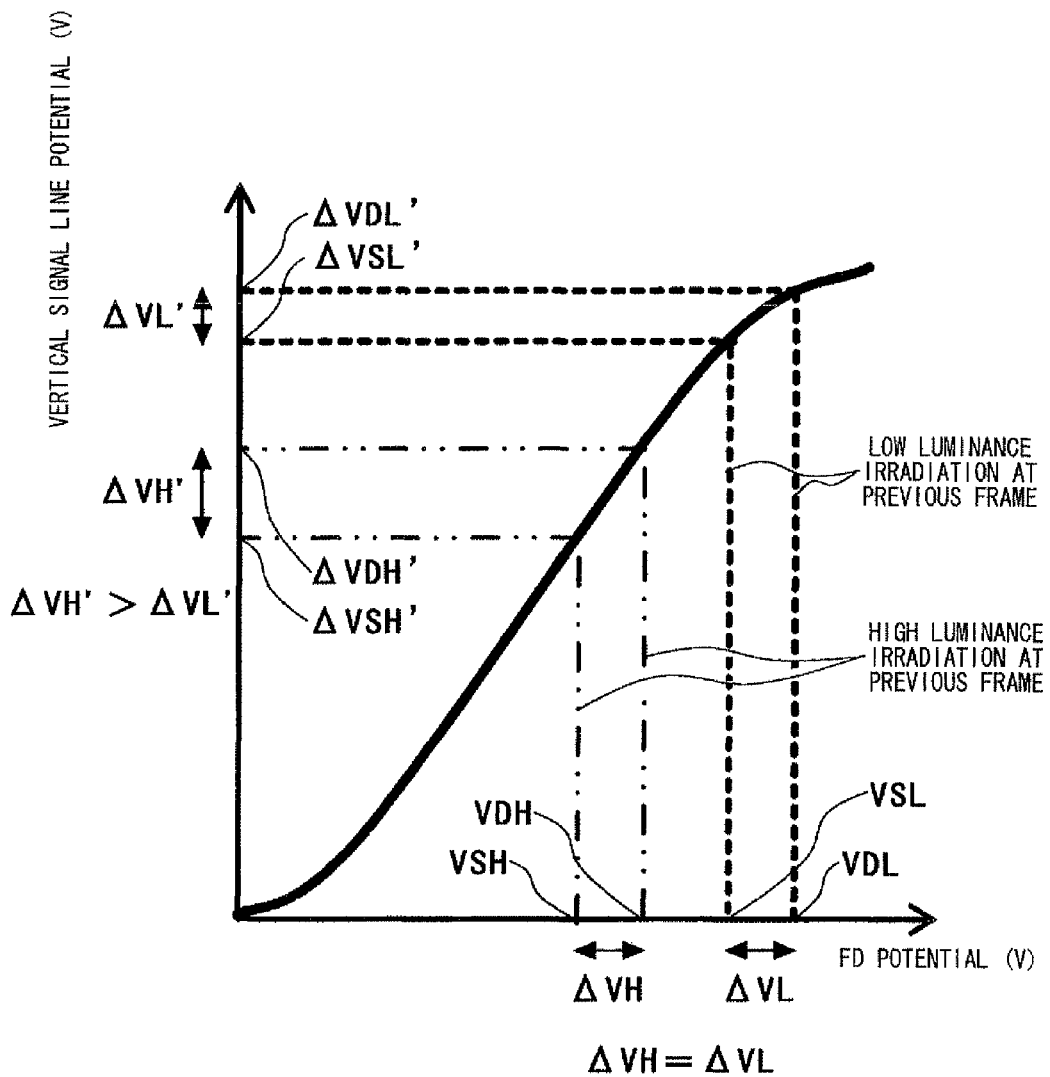
FIG. 7 is a view schematically illustrating a relationship between a potential of a floating capacitance unit and a potential of a vertical signal line.

The potential of the floating capacitance unit FD is the gate potential of the amplifier transistor AMP. The potential receiving an amplifier action in accordance with amplifier characteristics of the amplifier transistor AMP appears at the vertical signal line 24 as long as the selection transistor SEL is turned on and the source of the amplifier transistor AMP is coupled to the vertical signal line 24. FIG. 7 is a view schematically illustrating a relationship between the potential of the floating capacitance unit FD and a vertical signal line potential under a state when the selection transistor SEL is turned on. The relationship between the potential of the floating capacitance unit FD and the vertical signal line potential has not a complete linear relationship but nonlinearity reflecting that the amplifier transistor AMP does not have an ideal and complete linearity.

As illustrated in FIG. 7, vertical signal line potentials of VDL', VSL', VDH', and VSH' can be obtained respectively corresponding to the above-stated potentials VDL, VSL, VDH, and VSH of the floating capacitance unit FD. It can be seen from FIG. 7 that $\Delta$VH'>$\Delta$VL' affected by the nonlinearity, even if $\Delta$VH=$\Delta$VL. Note that VDL−VSL=$\Delta$VL, VDH−VSH=$\Delta$VH, VDL'−VSL'=$\Delta$VL', VDH' VSH'=$\Delta$VH'.

Accordingly, in an image of the pixel 21 which was low luminance irradiation at the previous frame as a result of the above-stated CDS of this time, a degree of the white floating is small as a whole screen, but in an image of the pixel 21 which was high luminance irradiation at the previous frame as a result of the above-stated CDS at this time, a degree of the white floating is large as a whole screen. As a result, the pixel 21 which was high luminance irradiation at the previous frame looks white floating relative to peripheral pixels 21 (the pixels 21 which were low luminance irradiation at the previous frame), and an afterimage phenomenon occurs.

Hereinabove is a generation principle of the afterimage phenomenon in the comparative example. As a result of a study for the generation principle of the afterimage phenomenon, the present inventors found that it is possible to reduce the afterimage phenomenon compared to the comparative example by applying at least one of the following: (i) to make $\Delta$VH, $\Delta$VL small, and (ii) to make a difference between the potential of the floating capacitance unit FD at the reading time of this time of the pixel 21 which was high luminance irradiation at the previous frame and the potential of the floating capacitance unit FD at the reading time of this time of the pixel 21 which was low luminance irradiation at the previous frame (hereinafter called as an "FD potential difference at the reading time") small. When the (i) is applied, the difference between the $\Delta$VL' and the $\Delta$VH' becomes small if the (ii) is not applied (refer to FIG. 7), and therefore, it is possible to reduce the afterimage phenomenon compared to the comparative example. When the (ii) is applied, the difference between the VDL and the VDH, the difference between the VSL and the VSH become small, and the difference between the $\Delta$VH and the $\Delta$VH' becomes small (refer to FIG. 7). Therefore, it is possible to reduce the afterimage phenomenon compared to the comparative example. When both of the (i) and the (ii) are applied, it is possible to more reduce the afterimage phenomenon.

In the present embodiment, the dummy pulse signals φGH, φHCLK1, φHCLK2, and φRSTH are supplied at the period t9 to t12 during the horizontal blanking period of the horizontal period of the first row (refer to [5] in FIG. 4) as stated above different from the comparative example, and it is the same as for the other horizontal periods. During these high frequency pulse signals φGH, φHCLK1, φHCLK2, and φRSTH are supplied, the DGND potential (the off potential of the reset transistor RES) varies toward the plus side caused by the IR drop. According to the present embodiment, the dummy pulse signals φGH, φHCLK1, φHCLK2, and φRSTH are supplied at the period t9 to t12, and thereby, the (i) is to be applied as it can be seen from FIG. 4. According to the present embodiment, it is possible to reduce the afterimage phenomenon compared to the comparative example.

The dummy pulse signals φGH, φHCLK1, φHCLK2, and φRSTH are not limited to the period t9 to t12, but it may be within at least a part of the period from among the period t6 to t13, and it is the same as for the other horizontal periods. However, it is preferable to stop the dummy pulse signals φGH, φHCLK1, φHCLK2, and φRSTH at the signal sampling time points t7, t13 as in the present embodiment. In this case, it is possible to prevent that a noise component incurred by the dummy pulse signals φGH, φHCLK1, φHCLK2, and φRSTH is mixed to a sampled signal, and it is thereby possible to improve an SN ratio.

Besides, it is preferable that a length TA of a period t6 to t7 from the time point t6 when the pulse signals φGH, φHCLK1, φHCLK2, and φRSTH are stopped just before the dark signal sampling time point t7 (the first sampling time point) to the time point t7, and a length TB of a period t12 to t13 from the time point t12 when the pulse signals φGH, φHCLK1, φHCLK2, and φRSTH are stopped just before the photo signal sampling time point t13 (the second sampling time point) to the time point t13 are the same. In this case, it is possible to make the ΔVH, ΔVL further smaller, and to more reduce the afterimage phenomenon.

Note that not all but one or more arbitrary signals from among the signals φGH, φHCLK1, φHCLK2, and φRSTH may be supplied as the dummy pulse signals to be supplied. Besides, for example, arbitrary repetitive pulse signals may be supplied as the dummy pulse signals to be supplied without being limited to the same signals as the one or more kinds of pulse signals φGH, φHCLK1, φHCLK2, and φRSTH from among the plural kinds of pulse signals φGH, φHCLK1, φHCLK2, and φRSTH. It is possible to obtain the similar afterimage reducing effect also in this case. Note that the repetitive pulse signals are to be supplied to, for example, parts where the one or more kinds of pulse signals from among the pulse signals φGH, φHCLK1, φHCLK2, and φRSTH are supplied in the horizontal scanning circuit 23.

Besides, in the present embodiment, the reset pulse φRES (1) of the first row is set at high level at the period t14 to t15 during the horizontal blanking period of the horizontal period of the first row (refer to [6] in FIG. 4) as stated above different from the comparative example, and it is the same as for the other horizontal periods. Therefore, according to the present embodiment, the reset of the floating capacitance unit FD (1) of the first row more approximates to a complete one, and as a result, the (ii) is to be applied (refer to [7] in FIG. 4). Therefore, according to the present embodiment, it is possible to reduce the afterimage phenomenon compared to the comparative example also from this point.

Instead that the reset pulse φRES (1) of the first row is set at high level at the period t14 to t15, the reset pulse φRES (1) may be set at high level at an arbitrary period of at least a part from among the period t13 to t16. It is also possible to obtain the similar afterimage reducing effect also in this case.

Note that at the period t14 to t15, the reset pulse φRES (1) of the first row is set at high level, but the reset pulses φRES of the other rows may be stayed at low level. However, it is preferable that the reset pulses φRES of all rows are set at high level and the reset transistors RES of the all rows are turned on at the period t14 to t15 and periods corresponding to the period t14 to t15 at the other respective horizontal periods. In this case, it is possible to make the ED potential difference at the reading time smaller, and to more reduce the afterimage phenomenon.

Note that in the present embodiment, both of the (i) and the (ii) are applied as stated above, but either one of them may be applied in the present invention. Namely, in the present embodiment, the dummy pulse signals φGH, φHCLK1, φHCLK2, and φRSTH are not supplied at the period t9 to t12, and the same operation may be done as for the other horizontal periods. Besides, in the present embodiment, the reset pulse φRES (1) is set at low level at the period t14 to t15, and the same operation may be done as for the other horizontal periods.

The operation described with reference to FIG. 4 in advance relates mainly to the reading operation performed in a still image imaging mode. In case of a continuous imaging mode, the operation similar to the above-described reading operation is continuously performed. Besides, in a moving image imaging mode, the reading of the frame is repeatedly performed while opening the mechanical shutter after all pixels reset is performed at an operation start time. At this time, in the reading of each frame, the operation after t1 in FIG. 4 is basically performed on all rows (or on thinning out rows), and so-called a rolling shutter operation is performed.

Second Embodiment

Figure 8:
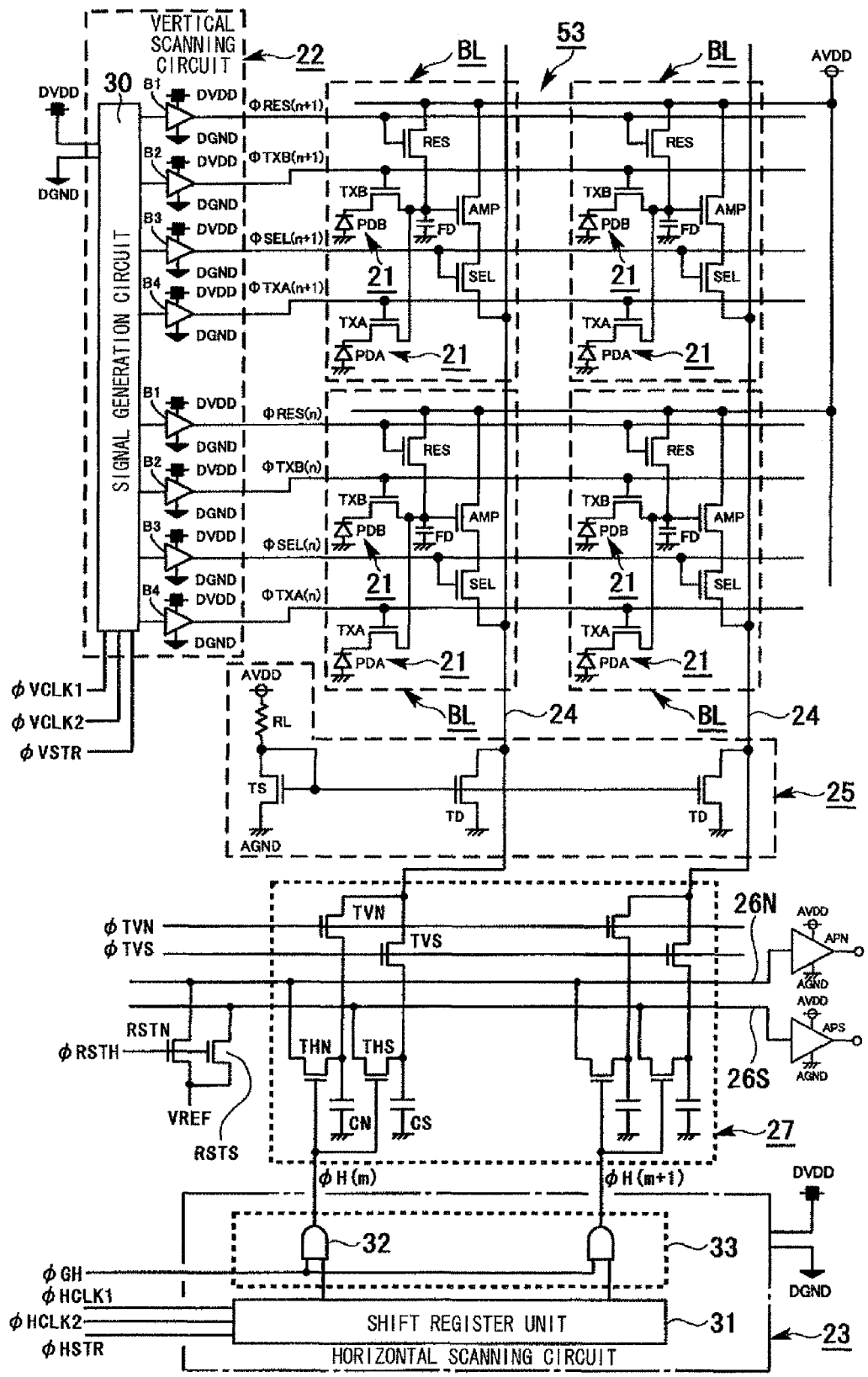
FIG. 8 is a circuit diagram illustrating a schematic configuration of a solid-state imaging device of an imaging device according to a second embodiment.

FIG. 8 is a circuit diagram illustrating a schematic configuration of a solid-state imaging device 53 of an imaging device according to a second embodiment of the present invention, and it corresponds to FIG. 2. In FIG. 2, the 2×2 pieces of pixels 21 are illustrated, but 4×2 pieces of pixels (2×2 pieces of pixel blocks BL) are illustrated in FIG. 8. In FIG. 8, the same reference symbols are used to designate the same and corresponding elements as FIG. 2, and the redundant description thereof will not be given.

A different point of the imaging device according to the present embodiment from the imaging device 1 according to the first embodiment is that the solid-state imaging device 53 illustrated in FIG. 8 is used instead of the solid-state imaging device 3 illustrated in FIG. 2.

Figure 10:
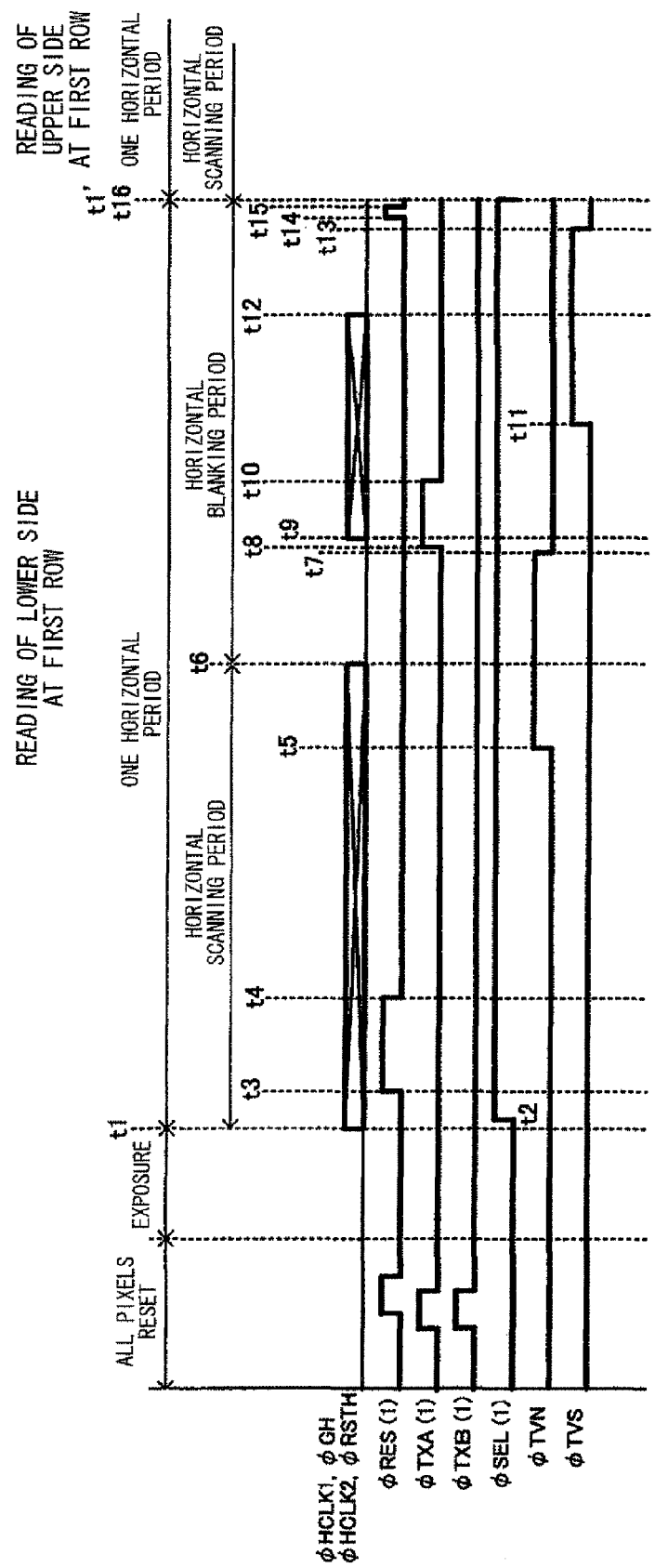
FIG. 10 is a timing chart illustrating an all pixels reset period, an exposure period, and a reading period of a pixel at a lower side of a pixel block at a first row.
Figure 11:
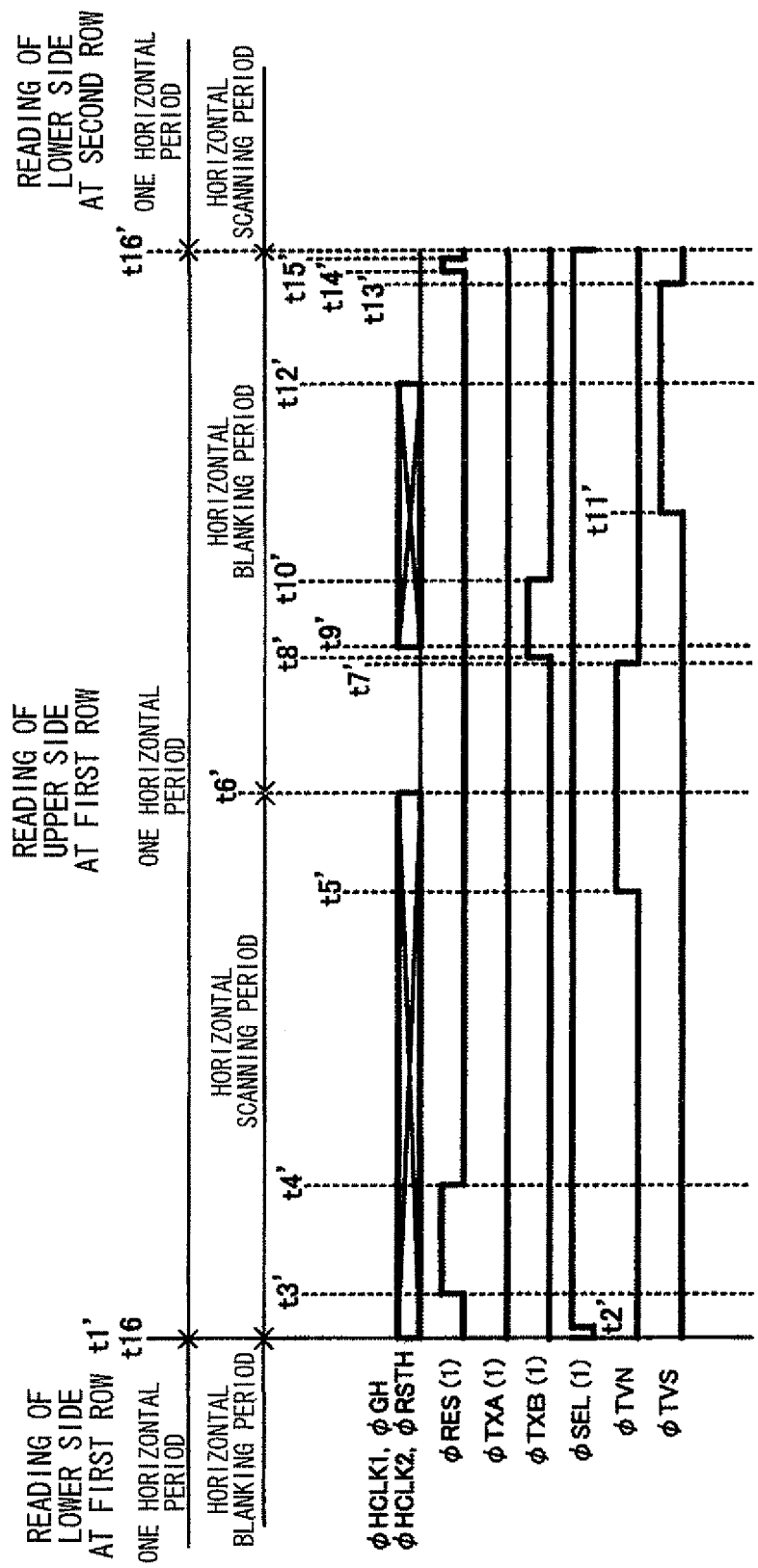
FIG. 11 is a timing chart illustrating a reading period of a pixel at an upper side of the pixel block at the first row in FIG. 9.

Different points of the solid-state imaging device 53 from the solid-state imaging device 3 are only that two pixels 21 adjacent in a column direction each have one set of the floating capacitance unit FD, the amplifier transistor AMP, the reset transistor RES, and the selection transistor SEL in common, and the vertical scanning circuit 22 is made up to output later-described control signals φSEL, φRES, φTXA, φTXB as illustrated in FIG. 10 and FIG. 11 instead of the control signals φSEL, φRES, φTX as illustrated in FIG. 4, and includes buffer circuits 81 to 84 outputting the above-stated signals. The buffer circuit B4 operates by the DVDD and the DGND as same as the buffer circuits 81 to B3.

In FIG. 8, the two pixels 21 commonly having the one set of the floating capacitance unit FD, the amplifier transistor AMP, the reset transistor RES, and the selection transistor SEL are represented as a pixel block BL. Besides, in FIG. 8, the photodiode PD and the transfer transistor TX of the pixel 21 at a lower side in the pixel block BL are respectively represented by reference symbols PDA, TXA, and the photodiode PD and the transfer transistor TX of the pixel 21 at an upper side in the pixel block EL are respectively represented by reference symbols PDB, TXB to distinguish them. Besides, a control signal supplied to a gate of the transfer transistor TXA is set to be φTXA, and a control signal supplied to a gate electrode of the transfer transistor TXB is set to be φTXB to distinguish them. Note that in FIG. 2, the "n" and so on represent the pixel row, but in FIG. 8, the "n" and so on represent a row of the pixel block EL. One row of the pixel block BL corresponds to two rows of the pixel 21.

Figure 9:
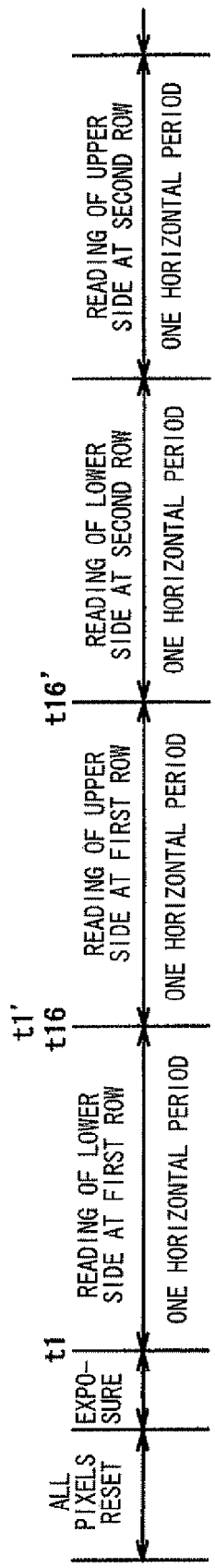
FIG. 9 is a view illustrating each operation period sequentially performed in the imaging device according to the second embodiment.

FIG. 9 is a view illustrating each operation period sequentially performed at the imaging device according to the second embodiment of the present invention. FIG. 10 is a timing chart illustrating an all pixels reset period, an exposure period, and a reading period of the pixel 21 at the lower side of the pixel block BL at the first row (one horizontal period) in FIG. 9. FIG. 11 is a timing chart illustrating the reading period of the pixel 21 at the upper side of the pixel block BL at the first row (one horizontal period) in FIG. 9. In FIG. 10 and FIG. 11, the same reference symbols are used to designate the same and corresponding elements as FIG. 4, and the redundant description thereof will not be given.

In the present embodiment, the mechanical shutter (not-illustrated) is opened for a predetermined exposure period after all pixels reset is performed, and after a charge is stored at charge storage layers of the photodiodes PDA, PDB of each pixel 21, the reading period of the pixel 21 at the lower side of the pixel block BL at the first row (one horizontal period), the reading period of the pixel 21 at the upper side of the pixel block BL at the first row (one horizontal period), the reading period of the pixel 21 at the lower side of the pixel block BL at the second row (one horizontal period), and the reading period of the pixel 21 at the upper side of the pixel block BL at the second row (one horizontal period) are sequentially performed, and further the similar reading period is sequentially performed for the pixel block at a third row as illustrated in FIG. 9. Note that in the present embodiment, a φTXA, a φTXB of all pixel block rows are set at high level at the all pixels reset period as illustrated in FIG. 10 instead that the φTX at the all pixel rows are set at high level in the first embodiment.

In FIG. 10, the same reference symbols t1 to t16 are added to time points respectively corresponding to the time points t1 to t16 in FIG. 4. In FIG. 11, reference symbols t1' to t16' are added to time points respectively corresponding to the time points t1 to t16 in the drawing. An end time point t16 of the reading period of the pixel 21 at the lower side of the pixel block BL at the first row is the same time point with a start time point t1' of the reading period of the pixel 21 at the upper side of the pixel block BL at the first row. In the present embodiment, the φTXA (1) is set at high level and the φTXB (1) is stayed at low level at a period t8 to t10 during the reading period of the pixel 21 at the lower side of the pixel block BL at the first row as illustrated in FIG. 10. Besides, the φTXA (1) is stayed at low level and the φTXB (1) is set at high level at a period t8' to t10' during the reading period of the pixel 21 at the upper side of the pixel block BL at the first row as illustrated in FIG. 11.

The similar advantages as the first embodiment can also be obtained according to the present embodiment. Note that the similar modification as the various modifications described as for the first embodiment may be applied to the present embodiment. Besides, in the present embodiment, the two pixels 21 adjacent in the column direction commonly have the one set of the floating capacitance unit FD, the amplifier transistor AMP, the reset transistor RES, and the selection transistor SEL, but in the present invention, for example, three or more predetermined number of pixels 21 adjacent in the column direction may commonly have the one set of the floating capacitance unit FD, the amplifier transistor AMP, the reset transistor RES, and the selection transistor SEL.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An imaging device, comprising:
   a plurality of pixels being disposed two-dimensionally and each having a photoelectric conversion unit, a charge-voltage conversion unit converting a charge transferred from the photoelectric conversion unit into a voltage, a transfer unit transferring the charge from the photoelectric conversion unit to the charge-voltage conversion unit, an amplifying unit outputting a pixel signal according to the voltage of the charge-voltage conversion unit, and a reset unit resetting the voltage of the charge-voltage conversion unit;
   a vertical driving unit supplying a driving signal driving the pixels to the plurality of pixels;
   vertical signal lines being provided to correspond to respective columns of the plurality of pixels and to which the pixel signal is supplied;
   a sample hold unit sampling and holding the pixel signal supplied to each of the vertical signal lines according to a sampling control signal, and supplying to horizontal signal lines according to a horizontal driving signal;
   a horizontal driving unit supplying the horizontal driving signal to the sample hold unit; and
   a horizontal driving control unit supplying a plurality of kinds of pulse signals relating to a reading of the pixel signal from the sample hold unit to the horizontal signal lines, wherein:
   a circuit controlling the reset unit among the vertical driving unit is operated by an identical current source with the horizontal driving unit;
   the horizontal driving control unit supplies the plurality of kinds of pulse signals to the horizontal driving unit at each horizontal reading period; and
   the horizontal driving control unit supplies dummy pulse signals to the horizontal driving unit at least at a part of period during a period from a start time point of each horizontal blanking period to a last signal sampling time point at the horizontal blanking period from among signal sampling time points defined by the sampling control signal.

2. The imaging device according to claim 1, wherein the dummy pulse signals are identical signals with one or more kinds of pulse signals from among the plurality of kinds of pulse signals.

3. The imaging device according to claim 2, wherein the one or more kinds of pulse signals include at least one kind of pulse signal being supplied to the horizontal driving unit and to make the horizontal driving unit generate the horizontal driving signal.

4. The imaging device according to claim 3, wherein:
the horizontal driving unit includes a shift register unit; and
the at least one kind of pulse signal includes a driving clock signal driving the shift register unit.

5. The imaging device according to claim 1, wherein the horizontal driving control unit stops the dummy pulse signals at the signal sampling time points.

6. The imaging device according to claim 1, wherein:
the signal sampling time points at each horizontal blanking period includes a second sampling time point sampling a photo signal containing photo information which is photoelectrically converted by the pixels, and a first sampling time point sampling a difference-purpose signal containing a noise component to be subtracted from the photo signal; and
a length of period from a time point when either of the one or more kinds of pulse signals or the dummy pulse signals are stopped just before the first sampling time point at each horizontal blanking period to the first sampling time point at the horizontal blanking period and a length of period from a time point when either of the one or more kinds of pulse signals or the dummy pulse signals are stopped just before the second sampling time point at each horizontal blanking period to the second sampling time point are the same.

7. The imaging device according to claim 1, wherein the vertical driving unit supplies a driving signal controlling the reset unit to the reset unit to make the reset unit perform a reset operation at least at a part of period from among a period from a last signal sampling time point at the horizontal blanking period to an end time point of the horizontal blanking period at each horizontal blanking period.

8. The imaging device according to claim 1, wherein the plurality of pixels commonly have the charge-voltage conversion unit, the amplifying unit, and the reset unit by every two or more predetermined number of pixels where each photoelectric conversion unit is sequentially arranged in a column direction.

9. An imaging device, comprising:
a plurality of pixels being disposed two-dimensionally and each having a photoelectric conversion unit, a charge-voltage conversion unit converting a charge transferred from the photoelectric conversion unit into a voltage, a transfer unit transferring the charge from the photoelectric conversion unit to the charge-voltage conversion unit, an amplifying unit outputting a pixel signal according to the voltage of the charge-voltage conversion unit, and a reset unit resetting the voltage of the charge-voltage conversion unit;
a vertical driving unit supplying a driving signal driving the pixels to the plurality of pixels;
vertical signal lines being provided to correspond to respective columns of the plurality of pixels and to which the pixel signal is supplied; and
a sample hold unit sampling and holding the pixel signal according to a signal of each of the vertical signal lines in accordance with a sampling control signal, and supplying the signal being held to horizontal signal lines according to a horizontal driving signal, wherein
the vertical driving unit supplies a driving signal controlling the reset unit to the reset unit to make the reset unit perform a reset operation at least at a part of period from among a period from a last signal sampling time point at the horizontal blanking period to an end time point of the horizontal blanking period at each horizontal blanking period.

10. The imaging device according to claim 9, further comprising:
a horizontal driving unit supplying the horizontal driving signal to the sample hold unit; and
a horizontal driving control unit supplying a plurality of kinds of pulse signals relating to a reading of a signal from the sample hold unit to the horizontal signal lines, wherein
a circuit controlling the reset unit among the vertical driving unit is operated by an identical current source with the horizontal driving unit.

11. The imaging device according to claim 9, wherein the plurality of pixels commonly have the charge-voltage conversion unit, the amplifying unit, and the reset unit by every two or more predetermined number of pixels where each photoelectric conversion unit is sequentially arranged in a column direction.

* * * * *